United States Patent
Togawa (10) Patent No.: US 8,159,073 B2
(45) Date of Patent: Apr. 17, 2012

(54) INTERPOSER CHIP AND MANUFACTURING METHOD THEREOF

(75) Inventor: Ryuichi Togawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 105 days.

(21) Appl. No.: 12/835,365

(22) Filed: Jul. 13, 2010

(65) Prior Publication Data

US 2011/0042823 A1 Feb. 24, 2011

(30) Foreign Application Priority Data

Aug. 19, 2009 (JP) .................................. 2009-190421

(51) Int. Cl.
*H01L 23/48* (2006.01)
(52) U.S. Cl. ................ 257/774; 257/777; 257/E23.011; 257/E21.499; 438/121
(58) Field of Classification Search .................. 257/774, 257/777, E23.011, E21.499; 438/121
See application file for complete search history.

(56) References Cited

U.S. PATENT DOCUMENTS

| 6,465,342 | B1 | 10/2002 | Taguchi et al. | |
| 6,782,610 | B1 * | 8/2004 | Iijima et al. | 29/827 |
| 7,642,650 | B2 | 1/2010 | Sugiura et al. | |
| 8,058,563 | B2 * | 11/2011 | Sakamoto et al. | 174/256 |
| 2007/0114668 | A1 | 5/2007 | Goto et al. | |
| 2009/0173530 | A1 * | 7/2009 | Sakamoto et al. | 174/261 |

FOREIGN PATENT DOCUMENTS

| JP | 2000-269215 A | 9/2000 |
| JP | 2004-282000 A | 10/2004 |
| JP | 2007-142333 A | 6/2007 |

* cited by examiner

*Primary Examiner* — Trung Q Dang
(74) *Attorney, Agent, or Firm* — Foley & Lardner LLP (57) ABSTRACT

The interposer chip includes a chip mounting region on which a semiconductor chip is mounted via a fixing material made of resin. The interposer chip has an insulator film, and wiring layers formed on the insulator film. At a position corresponding to a rim of the chip mounting region, a reinforcing region in which an adhesive force between the insulator film and the wiring layers are increased is provided.

18 Claims, 14 Drawing Sheets

REINFORCING REGION

REINFORCING REGION

INTERPOSER CHIP AND MANUFACTURING METHOD THEREOF

INCORPORATION BY REFERENCE

This patent application claims a priority on convention based on Japanese Patent Application No. 2009-190421. The disclosure thereof is incorporated herein by reference.

BACKGROUND OF THE INVENTION

1. Field of the Invention

The present invention relates to an interposer chip mounting a semiconductor chip and manufacturing method thereof, and particularly, to an interposer chip used in an SIP (System In a Package) structure in which a plurality of semiconductor chips are sealed in one package and manufacturing method thereof.

2. Description of Related Art

In a semiconductor device, a wiring layer is formed on an insulating film. It is required that the wiring layer is formed so as not to be stripped.

Technologies for obtaining a tough semiconductor structure are disclosed in document 1 (Japanese patent publication 2000-269215) and document 2 (Japanese patent publication 2004-282000).

Figure 1A:
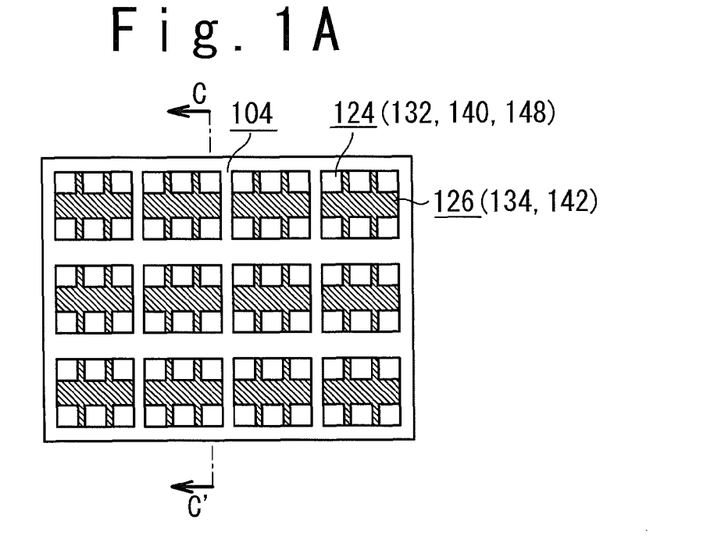
FIG. 1A is a plan view showing a related art.
Figure 1B:
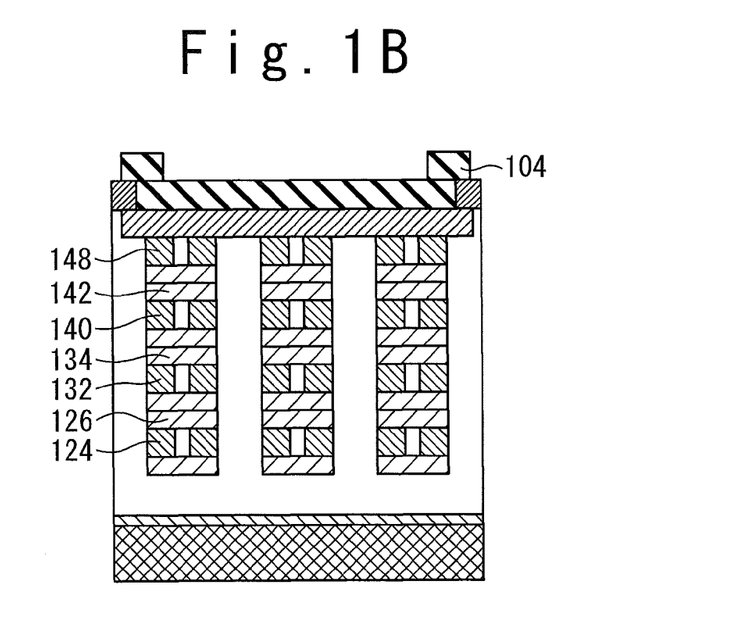
FIG. 1B is a sectional view showing the related art.

Furthermore, a semiconductor device is disclosed in document 3 (Japanese patent publication 2007-142333), whose object is to obtain a semiconductor device in which an under pad structure has a resistance against forces in a tucking direction, a stripping direction and a horizontal direction. FIG. 1A is a perspective plan view showing a pad part of the semiconductor device disclosed in document 3, and FIG. 1B is a sectional view showing a cross-section along C-C' in FIG. 1A. This semiconductor package includes reinforcement patterns (124, 126, 132, 134, 140, 142, and 148) arranged in an under pad region that is located under a pad 104. An occupancy rate of the reinforcement patterns is within a predetermined range, and an occupancy rate of the reinforcement patterns in a direction orthogonal to a predetermined chip edge part is larger than that in a direction parallel to the predetermined chip edge part.

By the way, with upgrading and increasing of functions in the semiconductor device such as system LSI (Large Scale Integration), a number of manufacturing processes is increased, and it becomes difficult to realize a high yield. From this viewpoint, an SIP (System In a Package) is focused, in which a plurality of universal semiconductor chips are sealed in one package. In the SIP, an interposer chip is used. The interposer chip is provided for changing an order of wirings extending from a plurality of semiconductor chips (rewiring), and has a rewiring layer for rewiring.

SUMMARY

Figure 2A:
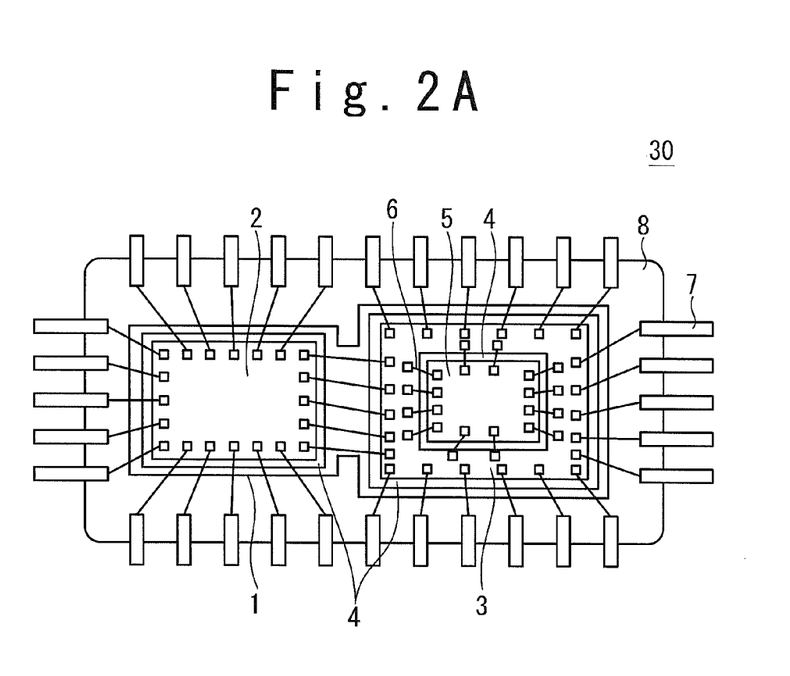
FIG. 2A is a plan view showing an SIP.
Figure 2B:
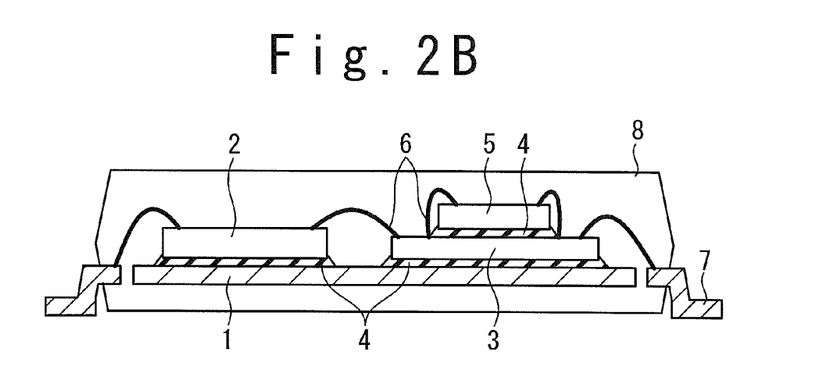
FIG. 2B is a sectional view showing the SIP.

FIG. 2A is a plan view showing an SIP 30, and FIG. 2B is a sectional view showing the SIP 30. As shown in FIG. 2A and FIG. 2B, the SIP 30 includes a lead frame (1,7), a first semiconductor chip 2, a second semiconductor chip 5, and an interposer chip 3. The first semiconductor chip 2 is mounted on an island part 1 of the lead frame, via a fixing material 4. The second semiconductor chip 5 is mounted on the island part 1 via the interposer chip 3. The interposer chip 3 is fixed on the island part 1 by the fixing material, and the second semiconductor chip 5 is also fixed on the interposer chip 3 by the fixing material. Even though an illustration is omitted, as mentioned above, a re-wiring layer is provided in the interposer chip 3. The interposer chip 3 is connected to the first semiconductor chip 2, the second semiconductor chip 5, and lead terminals 7 (package lead terminals) of the lead frame, via bonding wires 6. Moreover, the island part 1, the first semiconductor chip 2, the interposer chip 3 and the semiconductor chip 5 are sealed by a sealing resin 8.

According to a result of an investigation carried out by the inventor, it was revealed that a wiring of the interposer chip 3 may be stripped. Also, it was revealed that the stripping was related to a combination of the fixing material 4 and the sealing resin 8.

Figure 3A:
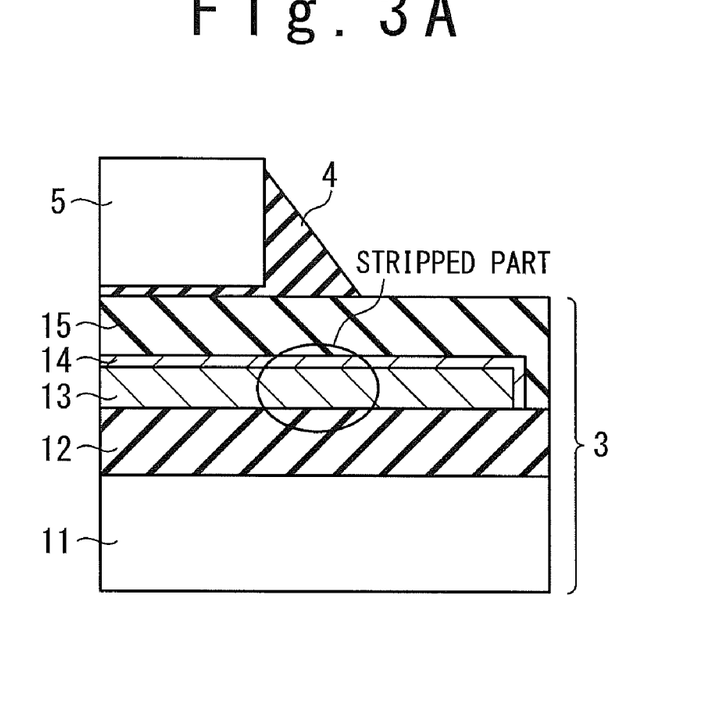
FIG. 3A is a sectional view schematically showing a part of an interposer chip.
Figure 3B:
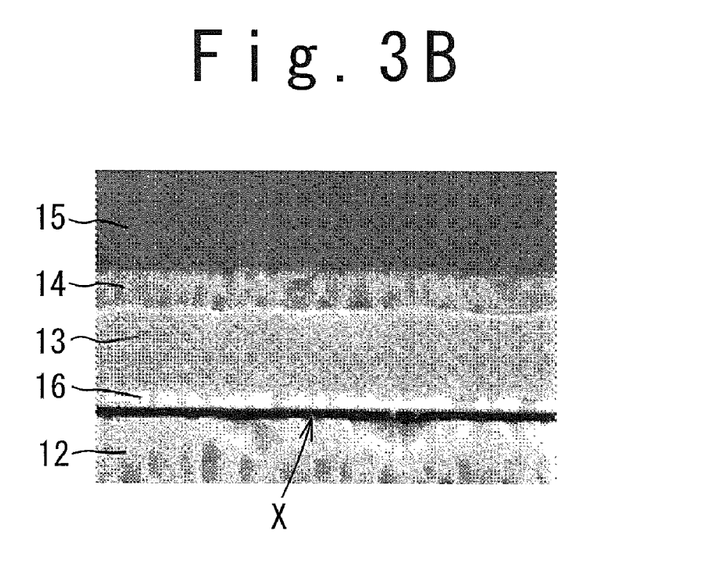
FIG. 3B is an electron micrograph of the interposer chip.

FIG. 3A is a sectional view showing the semiconductor chip 3. Referring to FIG. 3A, a stripped part will be explained. As shown in FIG. 3A, the interposer chip 3 includes a substrate 11, an interlayer insulator film 12 provided on the substrate 11, a wiring layer 13 provided on the interlayer insulator film 12, a cover insulator film 14 covering the wiring layer 13, and a passivation film 15 formed on the cover insulator film 14. The wiring layer 13 includes a barrier metal layer (not shown in FIG. 3A), and contacts to the interlayer insulator film 12 at the barrier metal layer. On the passivation film 15, the second semiconductor chip 5 is fixed by the fixing material 4. Here, a part in which the wiring layer 13 was stripped from the interlayer insulator film 12 was an under part of a rim of the second semiconductor chip 5 (a stripped part in the drawing). FIG. 3B shows an electron micrographic part of the stripped part. As shown in FIG. 3B, a clearance was formed between the interlayer insulator film 12 and the wiring layer 13 (shown as numeral X), and the barrier metal layer 16 of the wiring layer 13 was stripped from the interlayer insulator film 12.

Figure 4A:
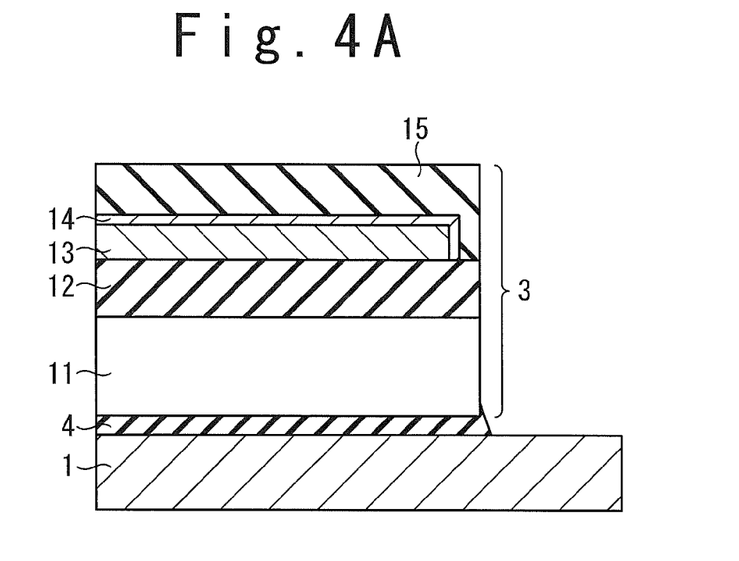
FIG. 4A is a sectional view showing a process for mounting a second semiconductor chip.

It will be explained why the wiring layer is easy to be stripped at the rim of the semiconductor chip. FIG. 4A to FIG. 4D are sectional views showing a process for mounting the second semiconductor chip 5 on the interposer chip 3. As shown in FIG. 4A, at first, the interposer chip 3 is fixed on the island part 1 of the lead frame by the fixing material 4.

Figure 4B:
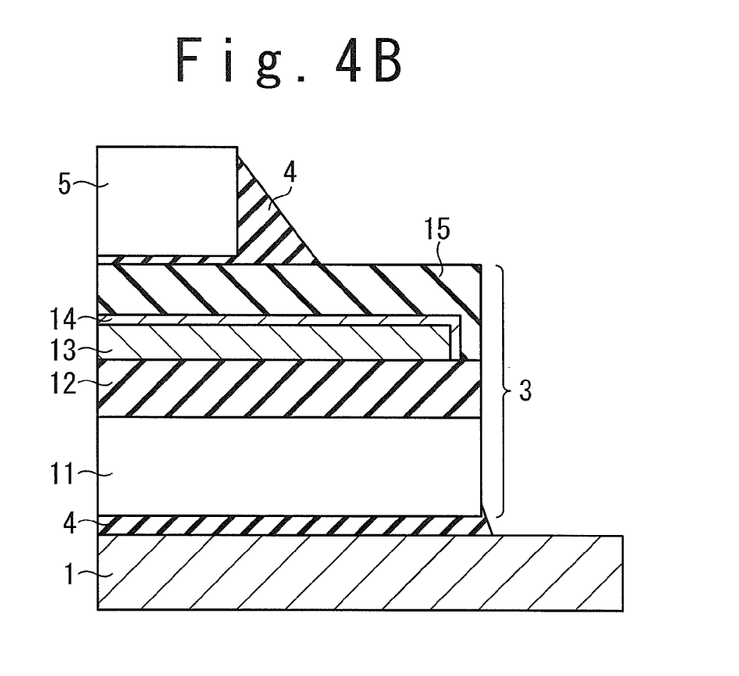
FIG. 4B is a sectional view showing a process for mounting a second semiconductor chip.

Next, as shown in FIG. 4B, the second semiconductor chip 5 is fixed on the passivation film 15 by the fixing material 4. Here, as the fixing material 4, a resin material is used. The fixing material 4 is applied on the passivation film 15. The semiconductor chip 5 is arranged on the applied fixing material 4, and the fixing material 4 is cured at a predetermined temperature. As a result, the second semiconductor chip 5 is fixed. When the second semiconductor chip 5 is mounted, the amount of the fixing material 4 is increased at a rim of the second semiconductor chip 5.

Figure 4C:
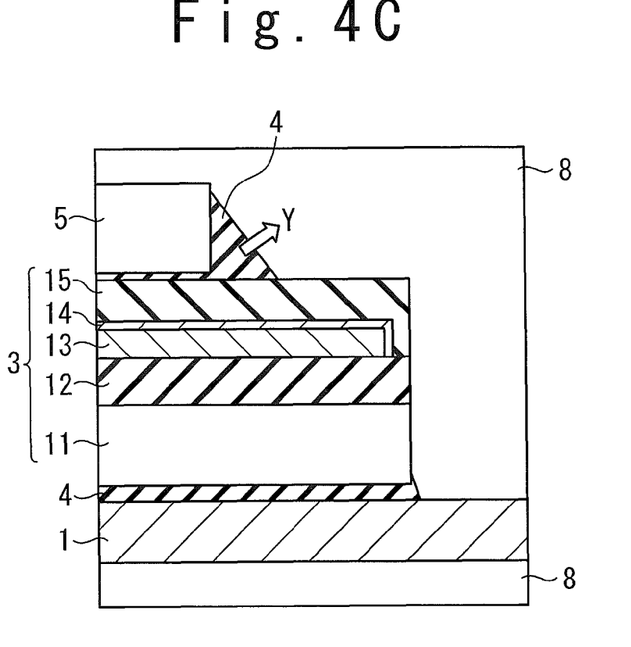
FIG. 4C is a sectional view showing a process for mounting a second semiconductor chip.

Next, as shown in FIG. 4C, the island part 1, interposer chip 3, and the second semiconductor chip 5 are sealed by the sealing resin 8. At the sealing, the sealing resin 8 is cured at a predetermined temperature. The sealing resin 8 is cooled after the curing.

It was revealed that the stripping of the wiring layers easily occurred when the curing temperature of the fixing material 4 was exceedingly lower than that of the sealing resin 8. When the curing temperature of the fixing material 4 is low, it is considered that the fixing material 4 is expanded by heat to a direction shown as an arrowed mark Y in the drawing when the sealing resin 8 is heated in a sealing process (refer to FIG. 4C). On the other hand, at the cooling in the sealing process, it is considered that the expanded fixing material 4 shrinks. By the shrinking, the fixing material 4 pulls a surface of the interposer chip 3 to a direction shown as an arrowed mark Z in FIG. 4D. As the result, the wiring layer 13 is easily stripped from the interlayer insulator film 12. A pulling force by the fixing material 4 is large at a rim of the semiconductor chip 5, because the amount of the fixing material 4 is increased.

Figure 4D:
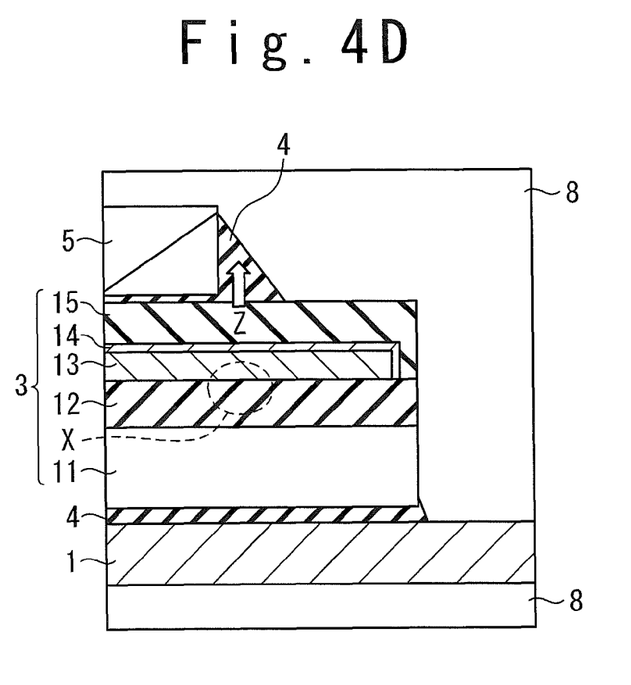
FIG. 4D is a sectional view showing a process for mounting a second semiconductor chip.

Accordingly, the wiring layer 13 is easily stripped at a part corresponding to the rim of the semiconductor chip 5 (a part shown by X in FIG. 4D).

An object of the present invention is to provide an interposer chip and a manufacturing method thereof, which can prevent stripping of the wiring in the interposer chip 3.

Meanwhile, in document 3, an object for reinforcing a structure is described, but a point regarding to the interposer chip 3 is not described. Additionally, in document 3, the technology for reinforcing an under pad structure is described, but a technology for preventing the stripping of the wirings at a rim of the semiconductor chip is not described. That is, when a stress for stripping the wiring layer is applied at a region other than a pad, the stripping of the wiring layer is not prevented at the region other than the pad. Moreover, only the re-wiring layer is required for the interposer chip of the SIP, and it is a disadvantage to provide a multi-layered structure for reinforcement.

The interposer chip according to the present invention includes a chip mounting region, and a semiconductor chip is mounted on the chip mounting region via the fixing material made of resin. The interposer chip includes an insulating film, and wiring layers formed on the insulating film. A reinforcing region is provided at a position corresponding to a rim of the chip mounting region, and an adhesion force between the insulating film and the wiring layers is enlarged at the reinforcing region.

According to this invention, since the adhesion force between the insulating film and the wiring layers is increased at the rim of the chip mounting region, the stripping of the wiring layers is prevented even though the fixing material shrinks.

The semiconductor device according to the present invention includes a main substrate, a first semiconductor chip mounted on the main substrate, and a second semiconductor chip mounted on the main substrate through the interposer chip.

The method according to the present invention is a manufacturing method of an interposer chip. The interposer chip includes a chip mounting region, and a semiconductor chip is mounted on the chip mounting region via a fixing material that is made of a resin. This method includes, forming an insulating film, forming a wiring layer on the insulating film, and forming a reinforcing region at a position corresponding to a rim of the chip mounting region. At the reinforcing region, an adhesion force between the insulating film and the wiring layer is increased.

The method of manufacturing the semiconductor device according to the present invention includes, mounting the semiconductor chip on the interposer chip with the fixing material, curing the fixing material by heat, sealing the semiconductor chip by a sealing material made of resin, and curing the sealing material by heat. The curing temperature of the fixing material is different from that of the sealing material.

In an another aspect, a method of manufacturing the semiconductor device according to the present invention includes, preparing a main substrate, mounting a first semiconductor chip on the main substrate, and mounting a second semiconductor chip on the main substrate via an interposer chip.

According to the present invention, an interposer chip and manufacturing method thereof are provided, which can prevent stripping of the wiring in the interposer chip.

BRIEF DESCRIPTION OF DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

[First Embodiment]

Referring to drawings, a first embodiment according to the present invention will be explained. The semiconductor device according to the present embodiment includes a lead frame (1,7), a first semiconductor chip 2, a second semiconductor chip 5, and an interposer chip 3, as the SIP shown in FIG. 2A and FIG. 2B. Since an overall configuration of the semiconductor device is same as the SIP shown in FIG. 2A and FIG. 2B, detailed descriptions will be omitted. In the present embodiment, a configuration of the interposer chip 3 is innovated.

Figure 5A:
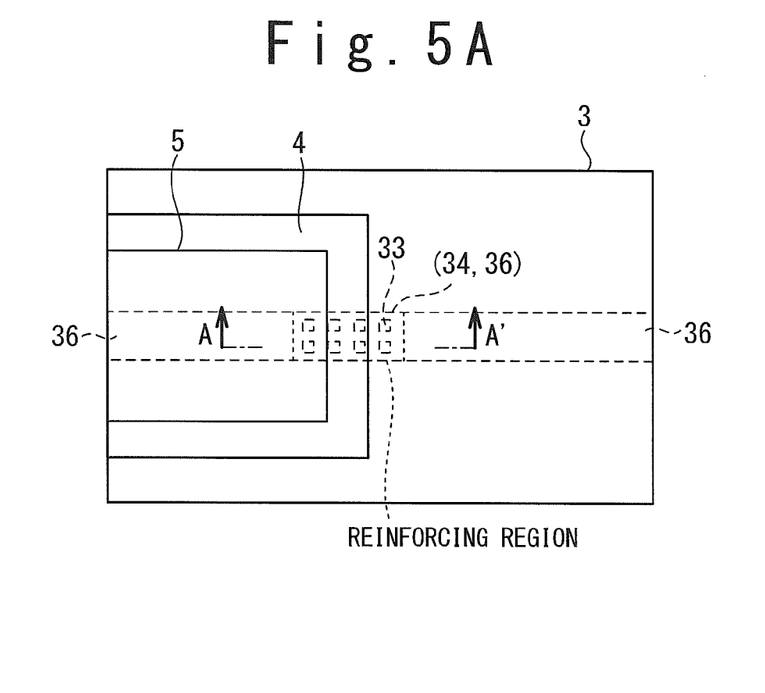
FIG. 5A is a perspective plan view showing an interposer chip according to a first embodiment.
Figure 5B:
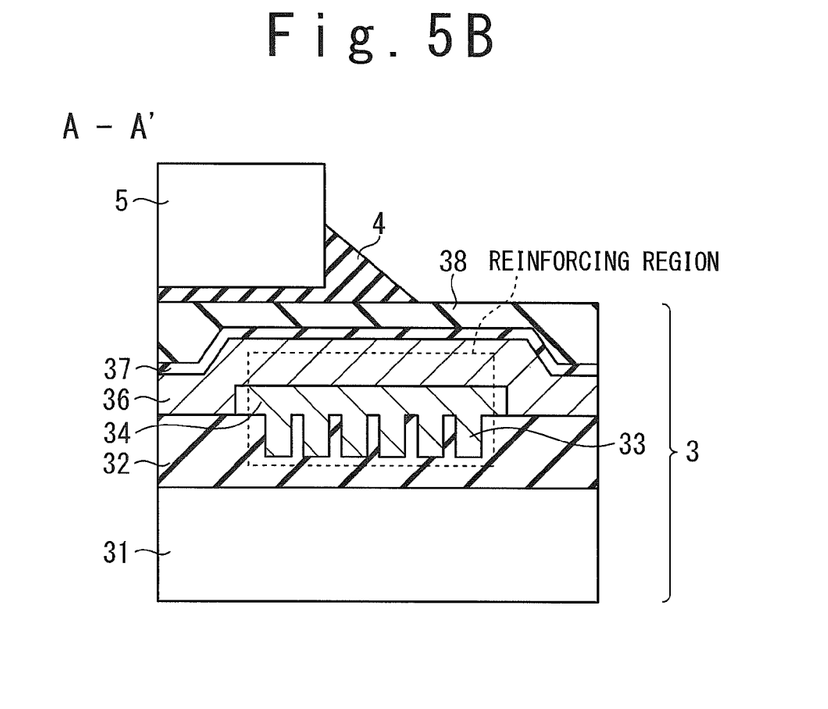
FIG. 5B is a sectional view showing the interposer chip according to the first embodiment.

FIG. 5A is a perspective plan view showing a part of the interposer chip 3. FIG. 5B is a sectional view showing a part of the interposer chip 3, and shows a cross-section along AA' in FIG. 5A.

As shown in FIG. 5B, the interposer chip 3 has a substrate 31, an interlayer insulator film 32, wiring layers (34, 36), a cover insulator film 37, and a passivation film 38.

As the substrate 31, for example, a silicon substrate is used.

The interlayer insulator film 32 is formed on the principal surface of the substrate 31. As the interlayer insulator film 32, for example, an SiO$_2$ layer or the like is used.

The wiring layers (34, 36) are formed on the interlayer insulator film 32. The wiring layers (34, 36) include a first wiring layer 34 and a second wiring layer 36. As the first wiring layer 34, a material that is easily filled in a via, such as tungsten, can be used. As the second wiring layer 36, a material having a low resistance, such as aluminum, can be used, and the second wiring layer 36 is formed on the interlayer insulator film 32 and the first wiring layer 34, via a barrier metal (Ti, TiN or the like) layer.

The cover insulator film 37 covers the wiring layers (34, 36). As the cover insulator film 37, for example, a plasma oxidized nitride film is used.

The passivation film 38 is provided on the cover insulator film 37, and protects the wiring layers (34, 36) and the cover insulator film 37. As the passivation film 38, for example, a polyimide resin film is used.

On the passivation film 38, the second semiconductor chip 5 is fixed by a fixing material 4. As the fixing material 4, a thermosetting resin is used, which is cured by heat. An amount of the fixing material 4 is increased at a rim of the second semiconductor chip 5.

As shown in FIG. 5A, the wiring layers (34,36) are arranged so as to cross a region on which the second semiconductor chip 5 is mounted (chip mounting region). A main portion of the wiring layers (34,36) is the second wiring layer 36. The second wiring layer 36 includes a barrier metal layer (Ti, TiN, [Ta,TaN] or the like), and formed on the first wiring layer 34 and the interlayer insulator film 32 via the barrier metal layer. An adhesion force between the barrier metal layer and the interlayer insulator film 32 is generally not so large. Accordingly, as mentioned above, at the rim of the second semiconductor chip 5, the wiring layers may be stripped by the shrink of the fixing material 4 at a cooling after a sealing process.

In the present embodiment, among a region in which the wiring layers (34, 36) are provided, a reinforcing region is provided on a position corresponding to the rim of the second semiconductor chip 5. The reinforcing region is a region in which an adhesion force between the wiring layers (34,36) and the interlayer insulator film 32 is larger than that in a surrounding region.

As shown in FIG. 5B, in the reinforcing region, a plurality of vias 33 (convexes) are provided in the interlayer insulator film 32. Bottom parts of the plurality of vias 33 are arranged in the interlayer insulator film. Namely, the plurality of vias 33 do not reach to the substrate 31. The plurality of vias 33 are filled with the first wiring layer 34. The first wiring layer 34 is a conductive layer and is formed of a material that is easily filled in the vias (for example, tungsten or the like). In the reinforcing region, the second wiring layer 36 is provided on the first wiring layer 34. Accordingly, in the reinforcing region, the second wiring layer 36 does not contact to the interlayer insulator film 32. At a region other than the reinforcing region, the second wiring layer 36 is directly formed on the interlayer insulator film 32.

Since the plurality of vias 33 are filled with the first wiring layer 34, the wiring layer (34,36) are not easy to be stripped from the interlayer insulator film 32. Moreover, in the reinforcing region, the second wiring layer 36 that is easily stripped from the interlayer insulator film 32 does not directly contact to the interlayer insulator film 32. From these viewpoints, the wiring layers (34,36) are not easy to be stripped from the interlayer insulator film 32.

Subsequently, the method for manufacturing the semiconductor device according to the present embodiment will be explained. FIG. 6A to FIG. 6E are sectional views showing the method for manufacturing the semiconductor device according to the present embodiment.

Figure 6A:
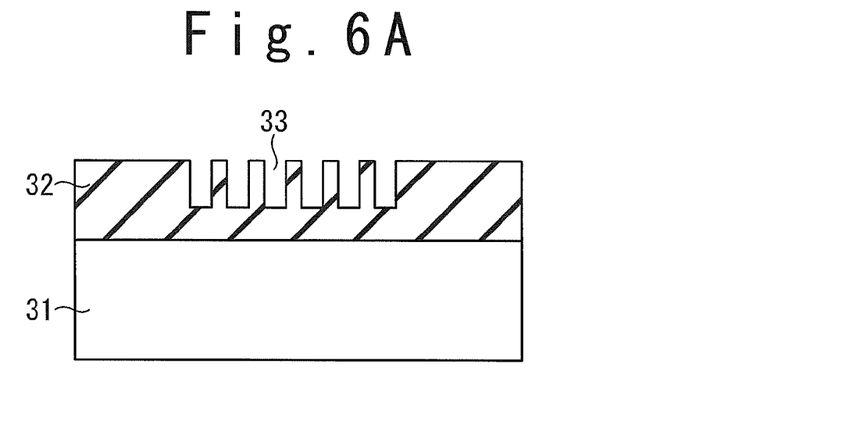
FIG. 6A is a sectional view showing a manufacturing method of the interposer chip according to the first embodiment.

At first, as shown in FIG. 6A, the interlayer insulator film 32 is formed on the substrate 31. Then, a plurality of vias 33 are formed in the interlayer insulator film 32.

Figure 6B:
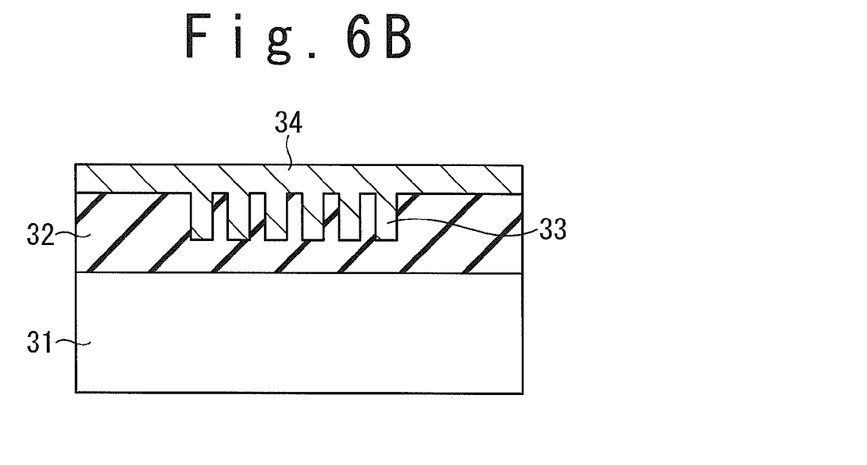
FIG. 6B is a sectional view showing the manufacturing method of the interposer chip according to the first embodiment.

Next, as shown in FIG. 6B, the first wiring layer 34 is deposited on a whole surface of the interlayer insulator film 32. At this time, the plurality of vias 33 are filled with the first wiring layer 34.

Figure 6C:
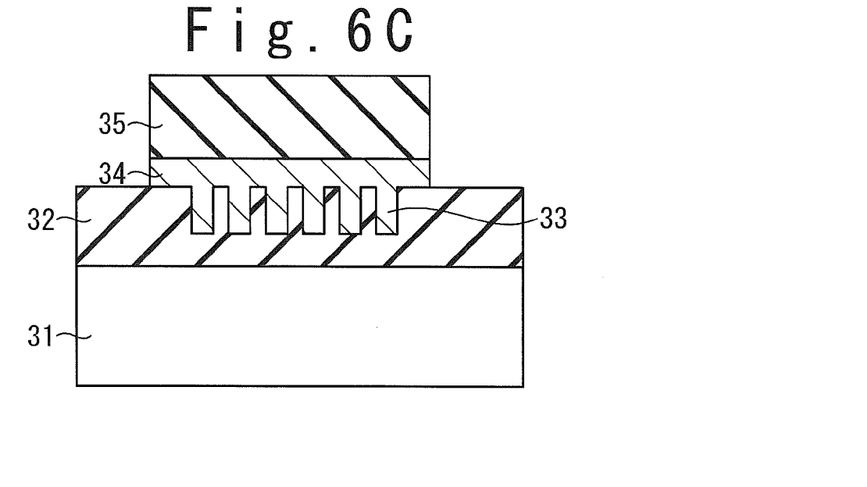
FIG. 6C is a sectional view showing the manufacturing method of the interposer chip according to the first embodiment.

Next, as shown in FIG. 6C, the reinforcing region is masked by a photo resist layer 35, and the first wiring layer 34 is etched.

Figure 6D:
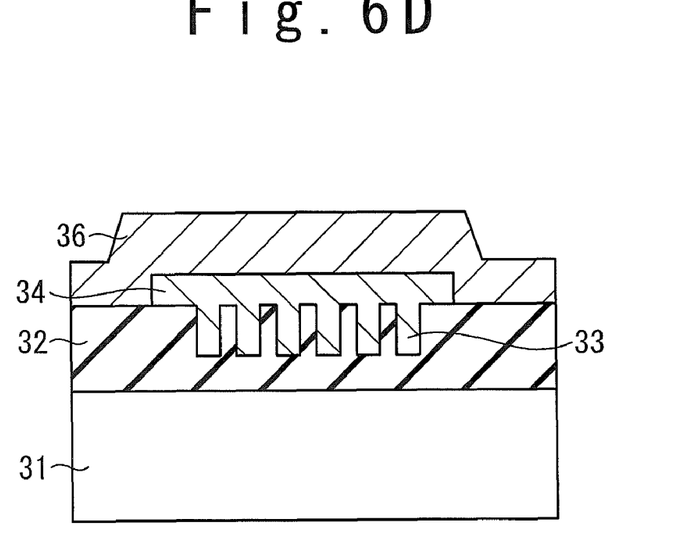
FIG. 6D is a sectional view showing the manufacturing method of the interposer chip according to the first embodiment.

Next, as shown in FIG. 6D, the second wiring layer 36 is deposited on the whole surface such that the first wiring layer 34 is covered. After that, a necessary pattern is masked by a photo resist, and the second wiring layer 36 is etched. As the result, wiring layers (34, 36) are formed to have a predetermined shape.

Figure 6E:
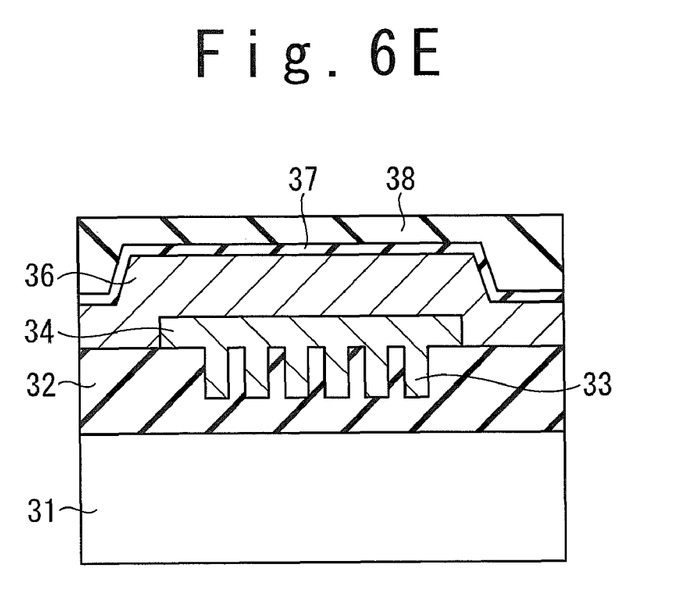
FIG. 6E is a sectional view showing the manufacturing method of the interposer chip according to the first embodiment.

Next, as shown in FIG. 6E, the cover insulator film 37 (for example, a plasma oxidized nitride film) and the passivation film 38 are deposited in this order such that the second wiring layer 36 is covered. Furthermore, openings are formed in the cover insulator film 37 and the passivation film 38 as windows for bonding. As the result, the interposer chip 3 is obtained.

The method for manufacturing the semiconductor device according to the present embodiment is similar to that shown in FIG. 4A to FIG. 4D. Namely, the first semiconductor chip 2 is arranged on an island part of a lead frame. Additionally, the interposer chip 3 obtained by the method mentioned above is arranged on the island part via the fixing material 4. Furthermore, the second semiconductor chip 5 is arranged on the passivation film 38 via the fixing material 4. After that, the first semiconductor chip 2 and the second semiconductor chip 5 are sealed by the sealing resin 8.

At this time, even if the curing temperature of the fixing material 4 is different from that of the sealing resin 8, since the wiring layers (34, 36) are strongly adhered to the interlayer insulator film 32 in the reinforcing region, the wiring layers (34,36) are prevented to be stripped. Namely, even if wiring patterns are arranged under the semiconductor chip, the stripping of the wiring layers caused by a sealing stress or pull force of the fixing material 4 can be prevented.

[Second Embodiment]

Subsequently, the second embodiment will be explained. In the present embodiment, configurations and forming method of the wiring layers (34,36) are changed from those of the first embodiment. Since the other points can be same as those of the first embodiment, detailed descriptions will be omitted.

Figure 7A:
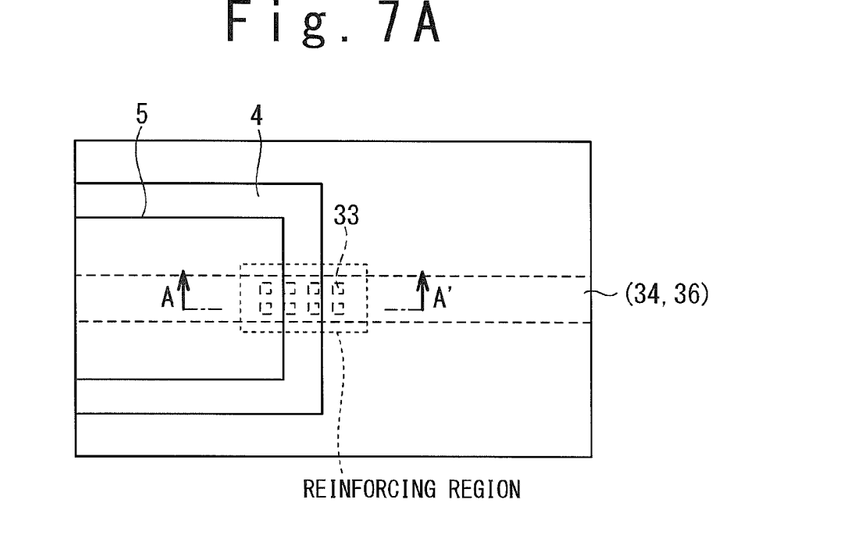
FIG. 7A is a perspective plan view showing an interposer chip according to a second embodiment.
Figure 7B:
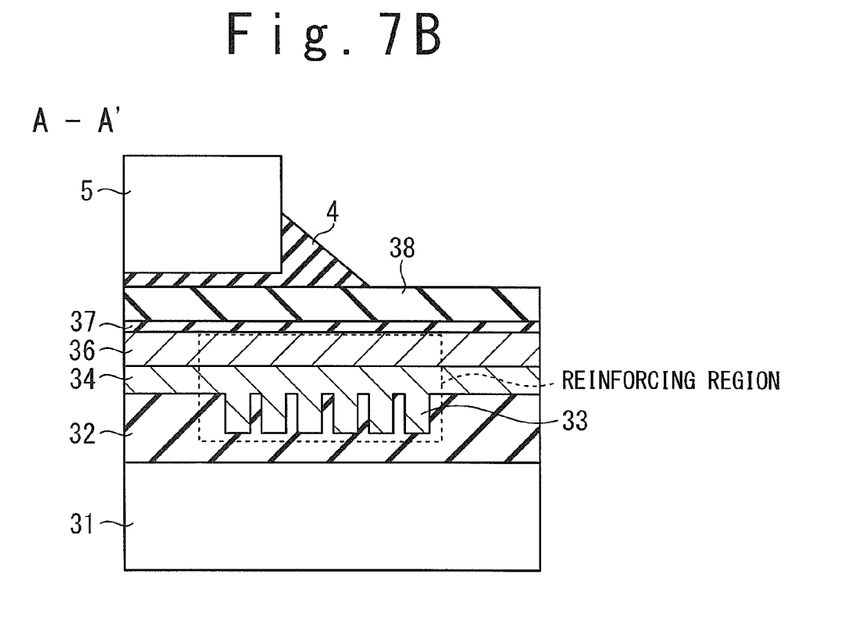
FIG. 7B is a sectional view showing the interposer chip according to the second embodiment.

FIG. 7A is a perspective plan view showing the interposer chip 3 according to the present embodiment, and FIG. 7B is a sectional view showing a cross-section along AA' in FIG. 7A. As shown in FIG. 7A and FIG. 7B, the first wiring layer 34 is provided at not only the reinforcing region but also a region other than the reinforcing region. The second wiring layer 36 is provided on the first wiring layer 34 and does not contact to the interlayer insulator film 32.

FIG. 8A to FIG. 8E are sectional views showing the manufacturing method of the interposer chip 3 according to the present embodiment.

Figure 8A:
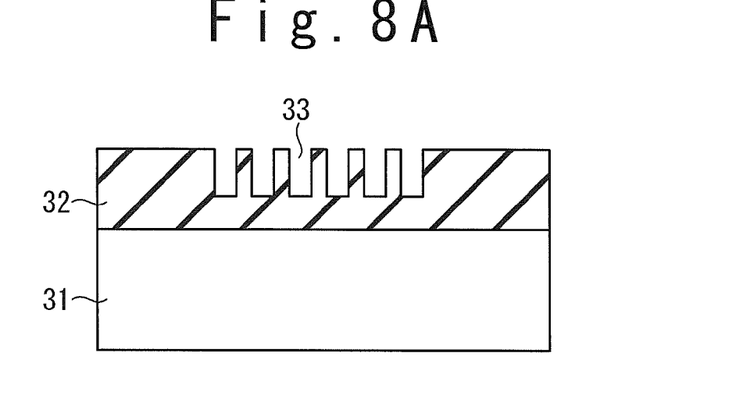
FIG. 8A is a sectional view showing a manufacturing method of the interposer chip according to the second embodiment.

At first, as shown in FIG. 8A, the interlayer insulator film 32 is formed on the substrate 31, and the plurality of vias 33 are formed so as not to reach to the substrate 31.

Figure 8B:
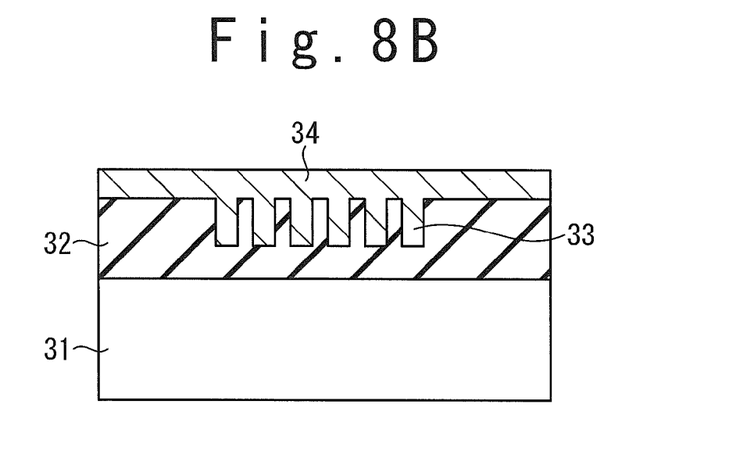
FIG. 8B is a sectional view showing the manufacturing method of the interposer chip according to the second embodiment.

Next, as shown in FIG. 8B, the first wiring layer 34 is formed by depositing a material for filling via (for example, tungsten). The plurality of vias 33 are filled with the first wiring layer 34.

Figure 8C:
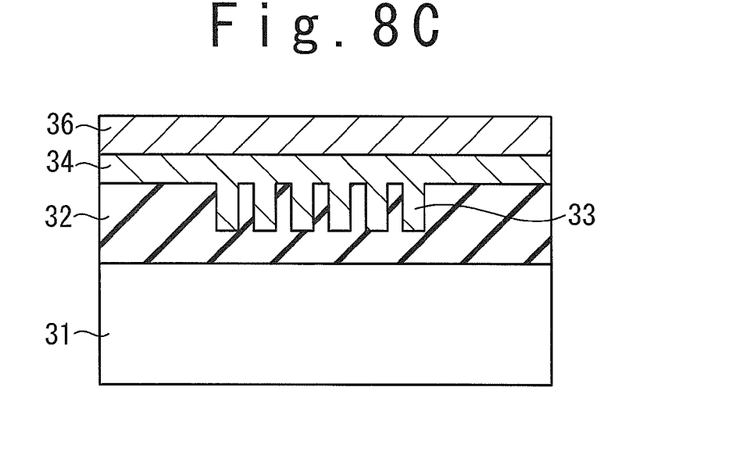
FIG. 8C is a sectional view showing the manufacturing method of the interposer chip according to the second embodiment.

Subsequently, as shown in FIG. 8C, the second wiring layer 36 exemplified by aluminum is deposited.

Figure 8D:
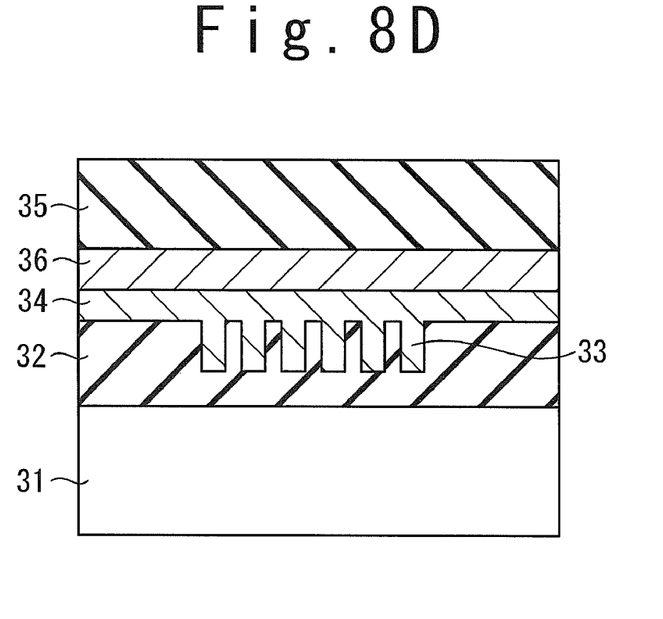
FIG. 8D is a sectional view showing the manufacturing method of the interposer chip according to the second embodiment.

Next, as shown in FIG. 8D, a part required as the wiring layers (34,36) is masked with the photo resist 35, and both of the first wiring layer 34 and the second wiring layer 36 are etched in one process. After etching, the photo resist 35 are stripped, and wiring patterns are obtained.

Figure 8E:
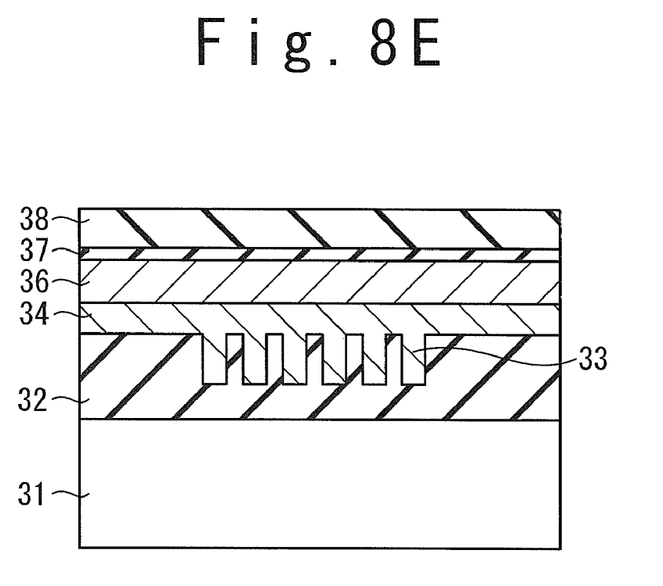
FIG. 8E is a sectional view showing the manufacturing method of the interposer chip according to the second embodiment.

After that, as shown in FIG. 8E, the cover insulator film 37 (for example, a plasma oxidized nitride film) and the passivation film 38 are deposited, and openings are provided as windows for bonding. As a result, the interposer chip 3 according to the present embodiment is obtained.

According to the present embodiment, the second wiring layer 36 that is easy to be stripped does not directly contact to the interlayer insulator film 32, also in a position other than the reinforcing region. Accordingly, the stripping of the wiring layers is absolutely prevented.

Moreover, in the present embodiment, since a thickness of the wiring layers is large, a condition for etching the wiring layers is stricter than that of the first embodiment (for example, increase of the etching time). Accordingly, the photo resist 35 is requested to have a high etching resistance. However, such problem can be resolved by increase of the thickness of the photo resist 35.

[Third Embodiment]

Subsequently, the third embodiment will be explained. In the present embodiment, configurations of the wiring layers in the reinforcing region are changed from those of the above-mentioned embodiments. Since the other points can be same as those of the above-mentioned embodiments, detailed descriptions will be omitted.

Figure 9A:
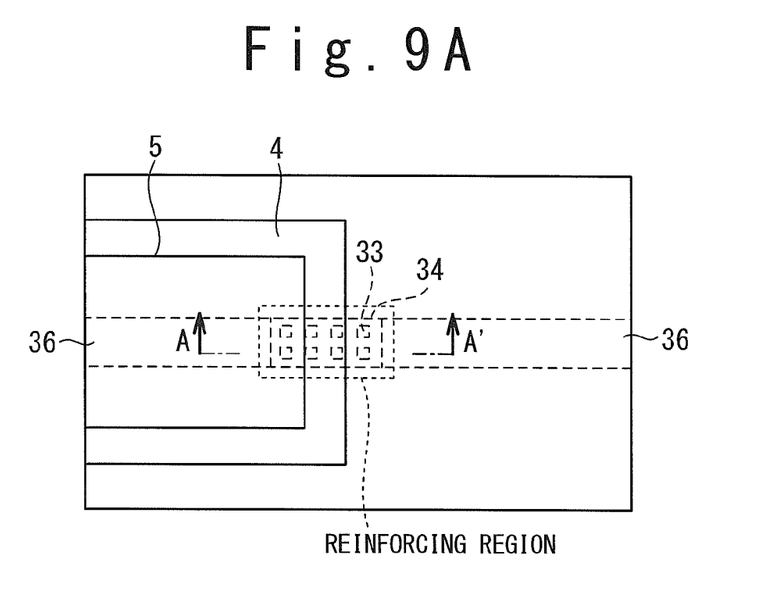
FIG. 9A is a perspective plan view showing an interposer chip according to a third embodiment.
Figure 9B:
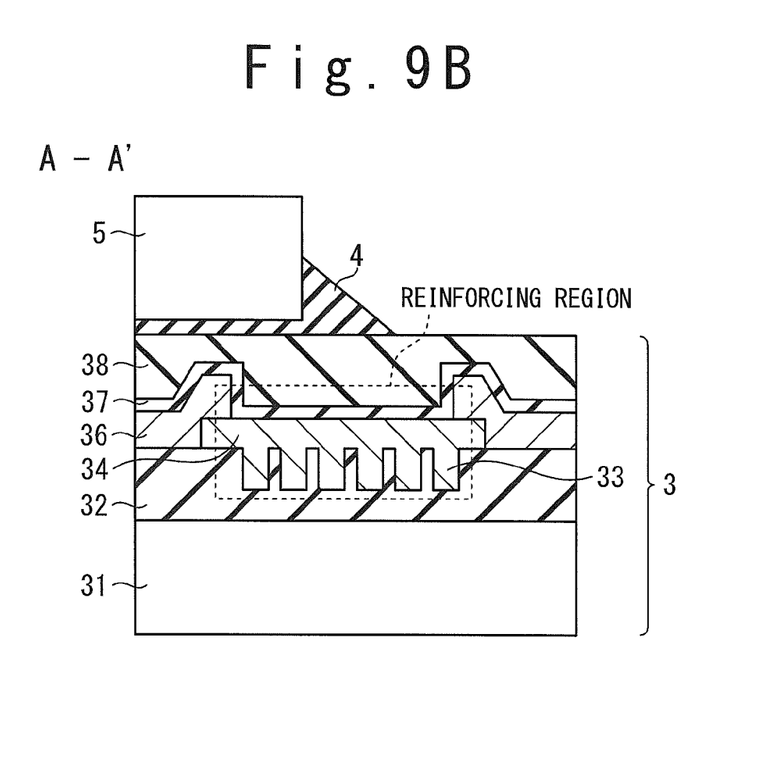
FIG. 9B is a sectional view showing the interposer chip according to the third embodiment.

FIG. 9A is a perspective plan view showing the interposer chip 3 according to the present embodiment, and FIG. 9B is a sectional view showing a cross-section along AA' shown in FIG. 9A.

As shown in FIG. 9A and FIG. 9B, in the present embodiment, the second wiring layer 36 is not provided in the reinforcing region. The second wiring layer 36 contacts to the first wiring layer 34 at an outside of the reinforcing region. In the reinforcing region, the cover insulator film 37 and the passivation film 38 are formed on the first wiring layer 34.

FIG. 10A to FIG. 10F are sectional views showing the manufacturing method of the interposer chip 3 according to the present embodiment.

Figure 10A:
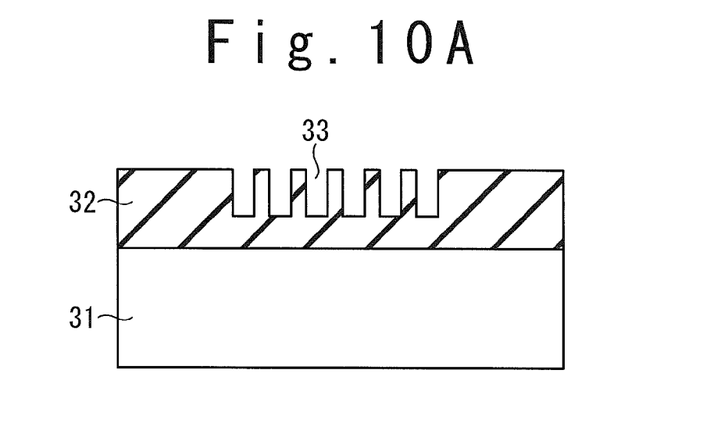
FIG. 10A is a sectional view showing a manufacturing method of the interposer chip according to the third embodiment.

At first, as shown in FIG. 10A, the interlayer insulator film 32 is formed on the substrate 31, and the plurality of vias 33 are formed so as not to reach to the substrate 31.

Figure 10B:
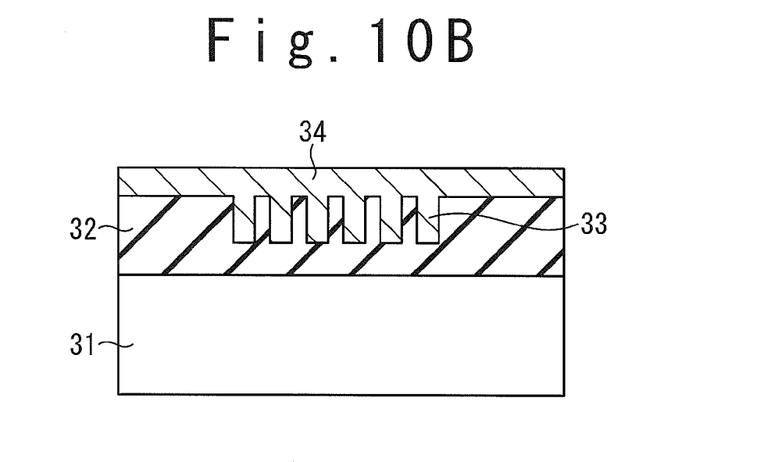
FIG. 10B is a sectional view showing the manufacturing method of the interposer chip according to the third embodiment.

Next, as shown in FIG. 10B, the first wiring layer 34 is formed by depositing a material for via filling (for example, tungsten) on the whole surface. The plurality of vias 33 are filled with the first wiring layer 34.

Figure 10C:
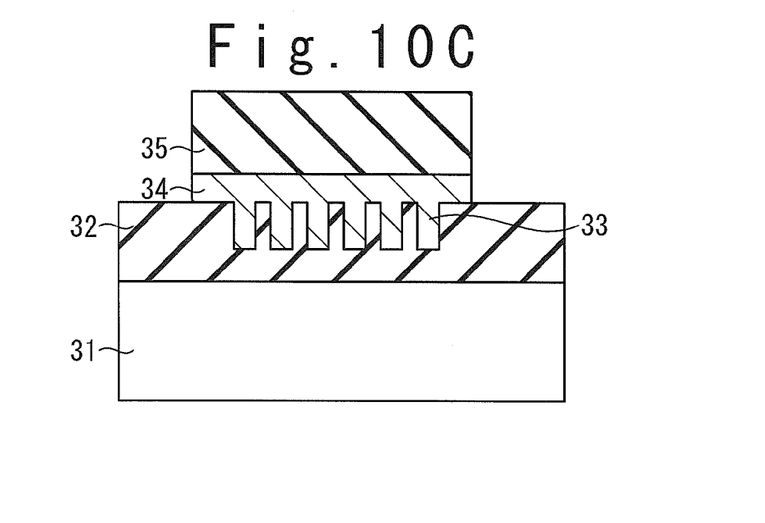
FIG. 10C is a sectional view showing the manufacturing method of the interposer chip according to the third embodiment.

Next, as shown in FIG. 10C, the reinforcing region is masked with the photo resist 35, and the first wiring layer 34 is etched in the part that is not masked.

Figure 10D:
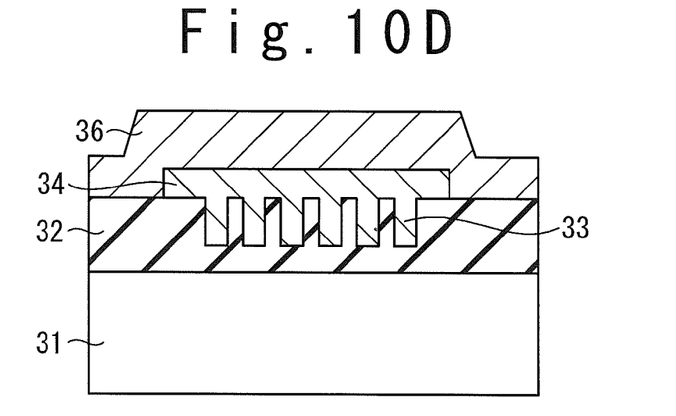
FIG. 10D is a sectional view showing the manufacturing method of the interposer chip according to the third embodiment.

Next, as shown in FIG. 10D, the photo resist 35 is stripped, and the second wiring layer 36 (for example, Al) is deposited.

Figure 10E:
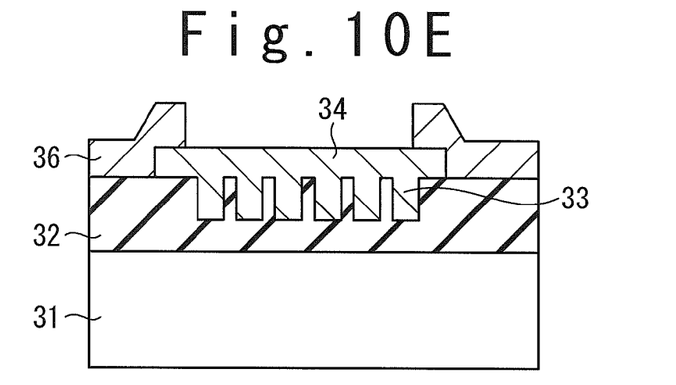
FIG. 10E is a sectional view showing the manufacturing method of the interposer chip according to the third embodiment.

Next, as shown in FIG. 10E, the second wiring layer 36 is etched with using a photo resist masking the reinforcing region. After etching, the photo resist is stripped to obtain the wiring pattern. Since the first wiring layer 34 is a conductive layer, an electric signal can pass through the reinforcing region, even if the second wiring layer 36 is removed from the reinforcing region.

Figure 10F:
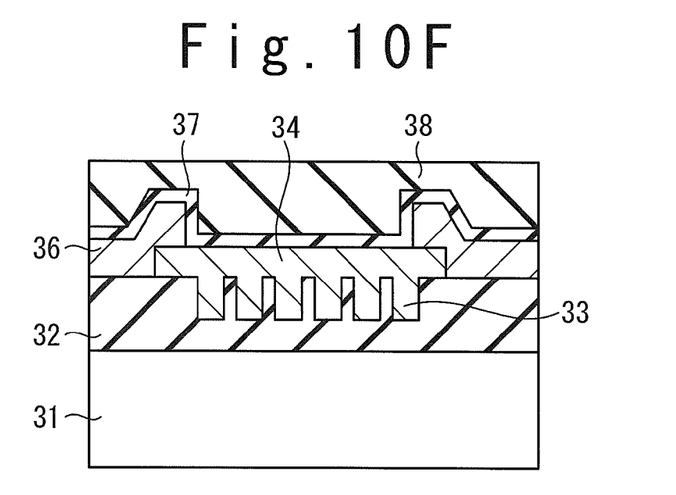
FIG. 10F is a sectional view showing the manufacturing method of the interposer chip according to the third embodiment.

Next, as shown in FIG. 10F, the cover insulator film 37 and the passivation film 38 are formed, and openings are formed as windows for bonding. As the result, the interposer chip 3 according to the present embodiment is obtained.

According to the present embodiment, in the reinforcing region, the second wiring layer 36 that is easy to be stripped is not provided. The second wiring layer 36 is far from a position to which a stress is applied by the fixing material 4. Accordingly, the stripping of the wiring layers is absolutely prevented.

Moreover, compared with the above-mentioned embodiments, in the reinforcing region, a material having high conductivity cannot be used as the first wiring layer 36, and the whole of the wiring layers are easy to have a high resistance. However, that is acceptable depending on an operation speed of a product.

What is claimed is:

1. An interposer chip, comprising:
    a chip mounting region on which a semiconductor chip is mounted via a fixing material made of resin;
    an insulator film;
    wiring layers formed on said insulator film; and
    a reinforcing region provided at a position corresponding to a rim of said chip mounting region,
    wherein an adhesive force between said insulator film and said wiring layers in said reinforcing region is larger than that in a surrounding region.

2. The interposer chip according to claim 1, wherein a plurality of vias are provided in said insulator film in said reinforcing region, and said plurality of vias are filled with said wiring layers.

3. The interposer chip according to claim 2, wherein said wiring layers comprise:
    a first wiring layer filled in said plurality of vias; and
    a second wiring layer provided so as to contact to said first wiring layer, and wherein said second wiring layer is provided not to contact to said insulator film in said reinforcing region.

4. The interposer chip according to claim 3, wherein said second wiring layer is formed on said first wiring layer in said reinforcing region.

5. The interposer chip according to claim 3, wherein said second wiring layer is not provided in said reinforcing region and contacts to said first wiring layer at outside of said reinforcing region.

6. The interposer chip according to claim 3, wherein said first wiring layer includes a tungsten component, and said second wiring layer includes an aluminum component.

7. The interposer chip according to claim 1, wherein said semiconductor chip is sealed by a sealing material made of resin, and said sealing material and said fixing material are different from each other in a curing temperature.

8. A semiconductor device, comprising:
a main substrate;
a first semiconductor chip mounted on said main substrate; and
a second semiconductor chip mounted on said main substrate via an interposer chip,
wherein said interposer chip comprises:
a chip mounting region on which said second semiconductor chip is mounted via a fixing material made of resin;
an insulator film;
wiring layers formed on said insulator film; and
a reinforcing region provided at a position corresponding to a rim of said chip mounting region, and
wherein an adhesive force between said insulator film and said wiring layers in said reinforcing region is larger than that in a surrounding region.

9. A method of manufacturing an interposer chip, said interposer chip having a chip mounting region and mounting a semiconductor chip on said chip mounting region via a fixing material made of resin, comprising:
forming an insulator film;
forming wiring layers on said insulator film; and
forming reinforcing region at a position corresponding to a rim of said chip mounting region,
wherein said reinforcing region is a region in which an adhesive force between said insulator film and said wiring layers is larger than that in a surrounding region.

10. The method of manufacturing the interposer chip according to claim 9, wherein said forming wiring layers comprises:
forming a plurality of vias in said insulator film; and
depositing said wiring layers so as to fill said plurality of vias.

11. The method of manufacturing the interposer chip according to claim 10, wherein said depositing said wiring layers comprises:
forming a first wiring layer so as to fill said plurality of vias; and
forming a second wiring layer so as to contact to said first wiring layer and not to contact to said insulator film in said reinforcing region.

12. The method of manufacturing the interposer chip according to claim 11, wherein said forming said first wiring layer comprises:
depositing said first wiring layer on a whole surface of said insulator film; and
etching said deposited first wiring layer to have a predetermined shape, and wherein said forming said second wiring layer comprises:
depositing said second wiring layer on said whole surface of said insulator film after said etching said deposited first wiring layer; and
etching said deposited second wiring layer to have a predetermined shape.

13. The method of manufacturing the interposer chip according to claim 12, wherein said etching said second wiring layer comprises, etching said second wiring layer such that said second wiring layer remains on said first wiring layer.

14. The method of manufacturing the interposer chip according to claim 12, wherein said etching said second wiring layer comprises, etching said second wiring layer such that said second wiring layer are removed from said reinforcing region and contacts to said first wiring layer at an outside of said reinforcing region.

15. The method of manufacturing the interposer chip according to claim 14, wherein said etching said first wiring layer and said etching said second wiring layer are carried out in one process.

16. The method of manufacturing the interposer chip according to claim 11, wherein said first wiring layer comprises a tungsten component, and said second wiring layer comprises an aluminum component.

17. A manufacturing method of a semiconductor device, comprising:
mounting a semiconductor chip on an interposer chip via a fixing material made of resin;
curing said fixing material by heat after said mounting;
sealing said semiconductor chip by a sealing material made of resin after said curing said fixing material; and
curing said sealing material by heat,
wherein said interposer chip comprises:
a chip mounting region on which said semiconductor chip is mounted;
an insulator film;
wiring layers formed on said insulator film; and
a reinforcing region provided at a position corresponding to a rim of said chip mounting region,
wherein an adhesive force between said insulator film and said wiring layers in said reinforcing region is larger than that in a surrounding region, and
wherein a curing temperature of said fixing material and a curing temperature of said sealing material are different from each other.

18. A manufacturing method of a semiconductor device, comprising:
preparing a main substrate;
mounting a first semiconductor chip on said main substrate; and
mounting a second semiconductor chip on said main substrate via an interposer chip,
wherein said interposer chip comprises:
a chip mounting region on which a semiconductor chip is mounted via a fixing material made of resin;
an insulator film;
wiring layers formed on said insulator film; and
a reinforcing region provided at a position corresponding to a rim of said chip mounting region,
wherein an adhesive force between said insulator film and said wiring layers in said reinforcing region is larger than that in a surrounding region, and
wherein a curing temperature of said fixing material and a curing temperature of said sealing material are different from each other.

* * * * *